United States Patent
Toyoda et al.

(10) Patent No.: US 6,845,032 B2
(45) Date of Patent: Jan. 18, 2005

(54) NON-VOLATILE LATCH CIRCUIT AND A DRIVING METHOD THEREOF

(75) Inventors: Kenji Toyoda, Osaka (JP); Takashi Ohtsuka, Toyonaka (JP); Kiyoshi Morimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/785,031

(22) Filed: Feb. 25, 2004

(65) Prior Publication Data

US 2004/0164778 A1 Aug. 26, 2004

Related U.S. Application Data

(63) Continuation of application No. PCT/JP03/15958, filed on Dec. 12, 2003.

(30) Foreign Application Priority Data

Dec. 25, 2002 (JP) ........................................ 2002-374496

(51) Int. Cl.[7] .............................................. G11C 11/22

(52) U.S. Cl. ................... 365/145; 365/185.24; 365/177

(58) Field of Search ............................ 365/145, 185.24, 365/177, 185.18, 65

(56) References Cited

U.S. PATENT DOCUMENTS 6,233,169 B1 * 5/2001 Nishimura .................. 365/145
6,314,016 B1   11/2001 Takasu

FOREIGN PATENT DOCUMENTS

| JP | P2000-124776 A | 4/2000 |
| JP | P2000-293989 A | 10/2000 |
| JP | P2001-283584 A | 10/2001 |

* cited by examiner

Primary Examiner—David Lam
(74) Attorney, Agent, or Firm—McDermott Will & Emery LLP

(57) ABSTRACT

Non-volatile latch circuit 10 of the present invention comprises ferroelectric capacitor 1 provided with a first electrode 1a, second electrode 1b, and ferroelectric film 1c that lies between these electrodes; reset terminal Tre that is connected to first electrode 1a and a CMOS inverter element 2 that is connected to second electrode 1b of ferroelectric capacitor 1; voltage switching terminal Tpl that applies a voltage to second electrode 1b; switching element 5 that is connected between second electrode 1b and second input terminal Tpl and switches a voltage applied to second electrode 1b; and set terminal Tse that applies a voltage for switching on or off switching element 5, wherein the voltage generated in second electrode 1b caused by polarization retained by ferroelectric film 1c is higher than the threshold voltage Vtn of NMISFET 4 of CMOS inverter element 2.

21 Claims, 10 Drawing Sheets

(a)

(b)

(a)

(b)

(a)

(b)

(a)

(b)

(a)

(b)

NON-VOLATILE LATCH CIRCUIT AND A DRIVING METHOD THEREOF

This application is a continuation of PCT/JP03/15958, filed Dec. 12, 2003.

TECHNICAL FIELD

This invention relates to a latch circuit that has a non-volatile memory function using a ferroelectric material, and a driving method thereof.

BACKGROUND ART

In recent years, the integration of semiconductor integrated circuits has made significant advances due to the miniaturization of constituent MIS transistors. However, since leakage current increases when an MIS transistor, etc., is miniaturized, power consumption also increases. In particular, in DRAMs, SRAMs, etc., that use MIS transistors in their memory cells, an increase of power consumption poses a serious problem.

For this reason, in recent years, non-volatile memories, which retain information even when power is removed, attracted considerable attention. Because of the above-described property, a non-volatile memory does not require any operation to restore the condition that it was in at the time that the power supply was turned off, thereby reducing power consumption. Using this non-volatile memory, an MFMIS (metal-ferroelectric-metal-insulator-semiconductor), which integrates a storage unit that has a non-volatile memory storage function and a transistor that controls data writing, reading, etc., has been proposed. An MFMIS has a floating-gate type of transistor structure, wherein a ferroelectric film serving as a capacity insulating film is disposed between the floating gate of the transistor and a control electrode (upper electrode). The MFMIS utilizes the fact that the threshold of the transistor changes according to the spontaneous polarization that is generated in the ferroelectric film to read data in the film. Since a memory using MFMIS consists of a single transistor, it is attracting attention as the ultimate memory.

Examples of semiconductor devices using such MFMIS include those disclosed in Japanese Unexamined Patent Publication No. 2000-77986 (U.S. Pat. No. 6,314,016). In the semiconductor device disclosed in the publication, a ferroelectric storage unit is connected to the output end of a gate unit that consists of a sequential circuit, such as a latch circuit. This ferroelectric storage unit is designed to maintain the signal that appears at the output end in the form of a corresponding polarized state. With this configuration, even when the power is removed, data is retained by the ferroelectric storage unit.

However, in the MFMIS structure, the application of a voltage to the MFMIS control electrode is required not only for writing data but also for reading it. Accordingly, the properties of the ferroelectric film deteriorate due to the increased number of voltage applications required to read data.

The present invention aims to solve the above-mentioned problem and provide a non-volatile latch circuit that reduces the number of times that voltage is applied to the ferroelectric film for writing and reading data thus preventing deterioration of the ferroelectric properties, and a method for driving the same.

DISCLOSURE OF THE INVENTION

The present invention relates to a non-volatile latch circuit comprising:
a ferroelectric capacitor having a first electrode, a second electrode, and a ferroelectric film disposed between the first electrode and the second electrode;
a first input terminal for applying a voltage to the first electrode;
an inverter element having an input portion and an output portion, the input portion being connected to the second electrode of the ferroelectric capacitor;
a second input terminal for applying a voltage to the second electrode;
a switching element connected between the second electrode and the second input terminal for switching the voltage applied to the second electrode; and
a third input terminal for applying a voltage to the switching element to change the on/off-state thereof;
the inverter element outputting a high-level voltage to the output portion when a low-level voltage, which is lower than the threshold of the inverter element, is applied to the input portion thereof, and outputting a low-level voltage to the output portion when a high-level voltage, which is higher than the threshold of the inverter element, is applied to the input portion thereof;
the voltage that is generated at the second electrode by residual polarization in the ferroelectric film being higher than the threshold voltage of the inverter element when the voltage is applied to the first input terminal and the switching element is turned off.

The present invention also relates to a method for driving a non-volatile latch circuit comprising:
a ferroelectric capacitor having a first electrode, a second electrode, and a ferroelectric film disposed between the first electrode and the second electrode;
a first input terminal for applying voltage to the first electrode;
an inverter element having an input portion and an output portion, the input portion being connected to the second electrode of the ferroelectric capacitor;
a second input terminal for applying a voltage to the second electrode;
a switching element connected between the second electrode and the second input terminal for switching the voltage applied to the second electrode; and
a third input terminal for applying a voltage to the switching element to change the on/off state thereof;
the inverter element outputting a high-level voltage to the output portion when a low-level voltage, which is lower than the threshold of the inverter element, is applied to the input portion thereof, and outputting a low-level voltage to the output portion when a high-level voltage, which is higher than the threshold of the inverter element, is applied to the input portion thereof,
the high-level voltage being applied to the first input terminal while the switching element is kept in the off state; and
the voltage that is generated at the second electrode by residual polarization in the ferroelectric film when a low-level voltage is sequentially applied being higher than the threshold voltage of the inverter element;
the method for driving a non-volatile latch circuit also comprising a high-level latch step, a low-level latch step, and a reset step;
the high-level latch step having a first write substep followed by a first read subset, wherein
in the first write substep, a low-level voltage, which is lower than the threshold of the inverter element, is applied to the second input terminal, and a high-level voltage is applied to the third input terminal to turn on the switching element, so that the voltage applied to the input portion is made a low-level voltage that is lower than the threshold of the inverter element, and in the first read substep, the voltage that is applied to the input portion is kept at a level that is lower than the threshold of the inverter element;

the low-level latch step having a second write substep followed by a second read substep, wherein in the second write substep, a high-level voltage is applied to the first input terminal to generate a high-level voltage that is higher than the threshold of the inverter element in the input portion, while the switching element is turned off by applying a low-level voltage to the third input terminal, and in the second read substep, a high-level voltage, which is higher than the threshold of the inverter element, is kept in the input portion while the switching element is maintained in an off state; and in the reset step, a low-level voltage that is lower than the threshold of the inverter element is applied to the second input terminal, and the switching element is turned on.

BEST MODE FOR CARRYING OUT THE INVENTION

First Embodiment

Hereunder, the first embodiment of the non-volatile latch circuit will be explained with reference to the drawings.

Figure 1:
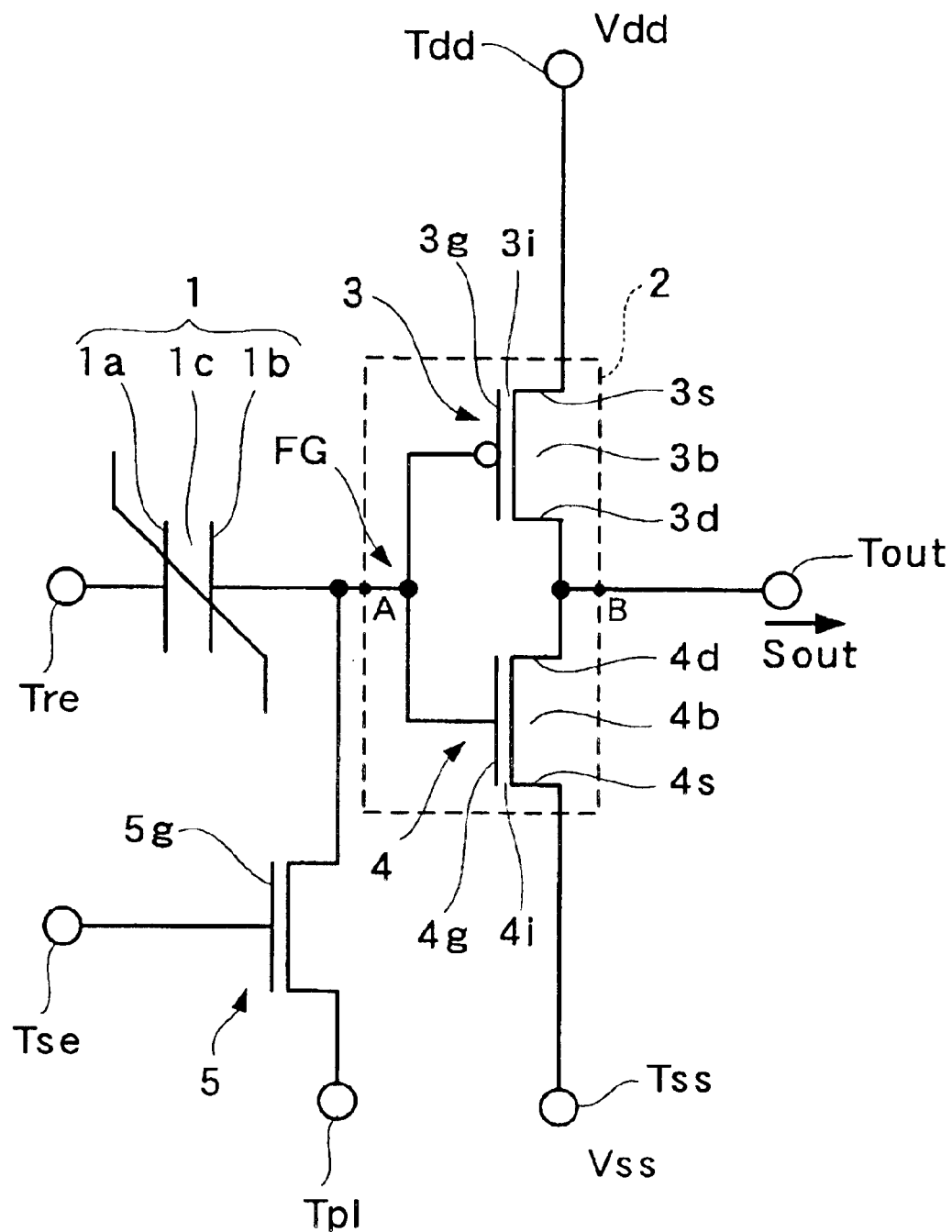
FIG. 1 is a circuit diagram showing the structure of a non-volatile latch circuit according to the first embodiment of the present invention.

FIG. 1 is a diagram schematically showing the structure of a non-volatile latch circuit of the present embodiment.

As shown in FIG. 1, non-volatile latch circuit 10 is provided with ferroelectric capacitor 1, CMOS inverter element 2, which comprises PMISFET 3 and NMISFET 4, and reset NMISFET 5.

Ferroelectric capacitor 1 is formed of first and second electrodes 1a and 1b, and ferroelectric film 1c inserted between first and second electrodes 1a and 1b. First electrode 1a is connected to reset terminal Tre (first input terminal), and second electrode 1b is connected to gate electrode 3g of PMISFET 3 and gate electrode 4g of NMISFET 4 through conductive members, such as a plug and electric wiring. There are many examples of ferroelectric materials that can form ferroelectric film 1c, for example, strontium bismuth tantalate (Y1: $SrBi_2TaO_9$). When the crystallinity of strontium bismuth tantalate is enhanced, the squareness ratio of the hysteresis loop of the ferroelectric can be improved.

Inverter element 2 comprises input portion A and output portion B. Inverter element 2 has a threshold. In inverter element 2, when a high-level voltage, which is higher than its threshold, is applied to input portion A, a low-level voltage is output from output portion B. In contrast, when a low-level voltage, which is lower than its threshold, is applied to input portion A of inverter element 2, a high-level voltage is output from output portion B.

Examples of inverter element 2 include CMOS inverter element 2 as shown in FIG. 1. CMOS inverter element 2 is explained in detail below.

PMISFET 3 and NMISFET 4 that constitute CMOS inverter element 2 are connected in series between supply terminal Tdd that supplies supply voltage Vdd and earth terminal Tss that supplies earth voltage Vss. PMISFET 3 is provided with substrate 3b, and gate insulating film 3i and gate electrode 3g that are disposed on the channel region of substrate 3b, wherein source region 3s is formed on one side of the channel region and drain region 3d is formed on the other side. Source region 3s is connected to supply terminal Tdd, and drain region 3d is connected to output terminal Tout.

NMISFET 4 has a structure similar to that of PMISFET 3, and is provided with substrate 4b, gate insulating film 4i, and gate electrode 4g, wherein source region 4s is formed on one end of the channel region of substrate 4b and drain region 4d is formed on the other end. Source region 4s of NMISFET 4 is connected to the above-described earth terminal Tss, and drain region 4d is connected to output terminal Tout similarly to drain region 3d of PMISFET 3. In the present embodiment, gate electrode 3g of PMISFET 3 and gate electrode 4g of NMISFET 4 are integrally formed having a common conductor film formed of, for example, a polysilicon film. These two gate electrodes 3g and 4g form common floating gate FG in latch circuit 10. The two gate electrodes 3g and 4g need not necessarily be formed in a united manner, as long as they are electrically connected. As shown in FIG. 1, in CMOS inverter element 2, portion A to which signal is input corresponds to the input portion of the present invention, and portion B from which signal is output corresponds to the output portion of the present invention.

Reset NMISFET 5 is connected between floating gate FG and voltage switching terminal Tpl (second input terminal) and constitutes a switching element for switching a voltage applied to floating gate FG. Gate electrode 5g of reset NMISFET 5 is connected to set terminal Tse (third input terminal), and reset NMISFET 5 is designed to be turned on or off in accordance with the input signals from set terminal Tse. As long as reset NMISFET 5 can be turned on or off in accordance with the input signals from set terminal Tse, it is possible to use other switching elements, such as PMISFETs instead of NMISFETs.

In latch circuit 10 having such a structure, polarization of ferroelectric film 1c of ferroelectric capacitor 1 is controlled according to the high- or low-relationship between the voltage applied to reset terminal Tre and set terminal Tse and the voltage applied to substrates 3b and 4b of MISFETs 3 and 4. It is possible to control the on- or off-state of MISFETs 3 and 4, and the logical value of output signal Sout that is output from output terminal Tout in accordance with the polarization of ferroelectric film 1c. In other words, it is possible to keep output signal Sout at high logical value "1 (High)" or low logical value "0 (Low)" in accordance with the polarization condition of the ferroelectric film. Hereunder, this feature will be explained in detail.

Figure 2:
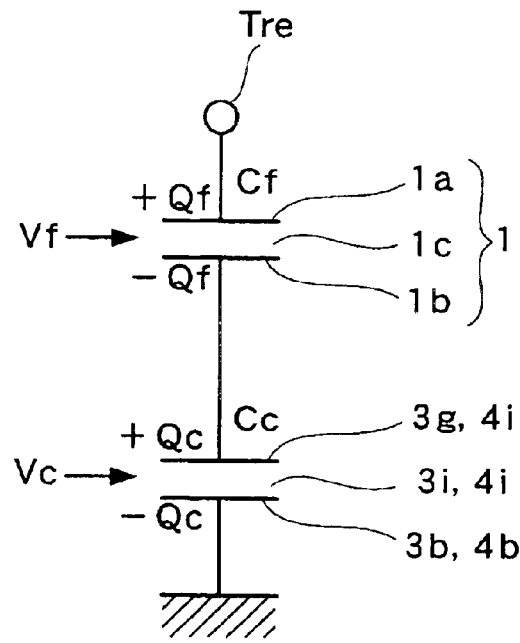
FIG. 2(a) is a circuit diagram showing the series structure of the ferroelectric capacitor and paraelectric capacitor in the non-volatile latch circuit of FIG. 1.
FIG. 2(b) is a drawing showing the hysteresis characteristics of the ferroelectric film.
Figure 2:
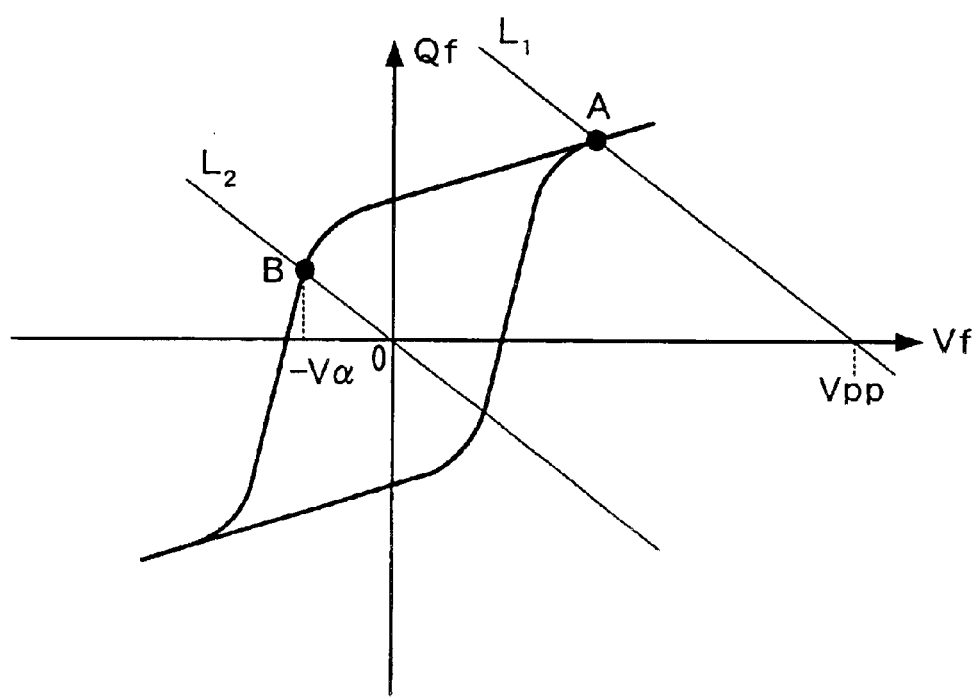

FIGS. 2(a) and 2(b) are respectively a circuit diagram showing the serial structure of the ferroelectric capacitor and MIS capacitor (paraelectric capacitor) in this non-volatile latch circuit and the hysteresis characteristics of the ferroelectric film. In FIG. 2(a), the MFMIS structure of non-volatile latch circuit 10 is shown as an MFM-MIM (Metal Ferroelectrics Metal-Metal Insulator Metal) structure. This MFM-MIM structure is composed of electrodes 1a and 1b of ferroelectric capacitor 1, ferroelectric film 1c, and the MIS capacitors of MISFETs 3 and 4 (gate electrodes 3g and 4g, substrates 3b and 4b, gate insulating films 3i and 4i). In other words, the MFM-MIM structure is such that ferroelectric capacitor 1 and each of the MIS capacitors of MISFETs 3 and 4 are serially connected between substrates 3b and 4b of MISFETs 3 and 4 and reset terminal Tre. In FIG. 2(a), gate insulating films 3i and 4i of MISFETs 3 and 4 are shown as an insulating film of one MIS capacitor. The capacity of ferroelectric capacitor 1 is expressed as Cf and capacity of paraelectric capacitor is expressed as Cc.

In this structure, when positive voltage Vpp is applied to reset terminal Tre and substrates 3b and 4b of each MISFET are grounded, voltage Vf is distributed to ferroelectric capacitor 1 and voltage Vc is applied to the paraelectric capacitor, wherein electric charges Qf and Qc respectively are then induced in each capacitor, in accordance with the applied voltage. In this condition, electric charge Qf of ferroelectric capacitor 1 exhibits hysteresis characteristics as shown in FIG. 2(b) in accordance with voltage Vf. Here, the condition wherein polarization is generated in ferroelectric film 1c with a positive charge on the 1a side of the electrode and a negative charge on the 1b side of the electrode is defined as positive polarization.

In accordance with voltage Vf, electric charge Qc of a paraelectric capacitor changes in the range defined by formula (1) below:

$$Qc = Cc \cdot Vc \quad (1)$$
$$= Cc \, (Vpp - Vf)$$

Therefore, as shown in FIG. 2(b), intercept A of straight line $L_1$ expressed by formula (1) and the hysteresis loop becomes the operating point.

When the voltage of reset terminal Tre is returned from Vpp to 0, the relationship between electric charge Qc and distributing voltage Vc in a paraelectric capacitor will become as expressed by formula (2) below:

$$Qc = Cc \cdot Vc \quad (2)$$
$$= -Cc \cdot Vf$$

Here, as shown in FIG. 2(b), intercept B of straight line $L_2$ expressed by formula (2) and the hysteresis loop becomes the operating point. As shown by the formula, under the condition where polarization is retained in ferroelectric film 1c of ferroelectric capacitor 1, when the voltage of reset terminal Tre becomes 0, an electric potential of $-V\alpha$ appears in ferroelectric film 1c. Here, because the voltage of ferroelectric film 1c is defined as positive, when first electrode 1a becomes positive and second electrode 1b becomes negative, the electric potential of floating gate FG becomes the hold potential $V\alpha$ having a positive electric potential.

Figure 3:
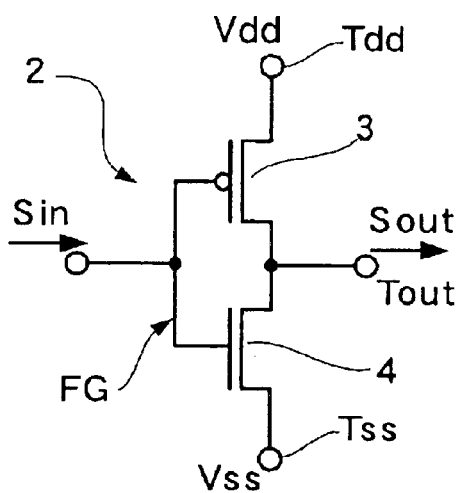
FIG. 3(a) is a circuit diagram showing only the inverter element in the non-volatile latch circuit of FIG. 1.
FIG. 3(b) is a drawing showing the change in an output signal in relation to a change in the voltage of an input signal.
Figure 3:
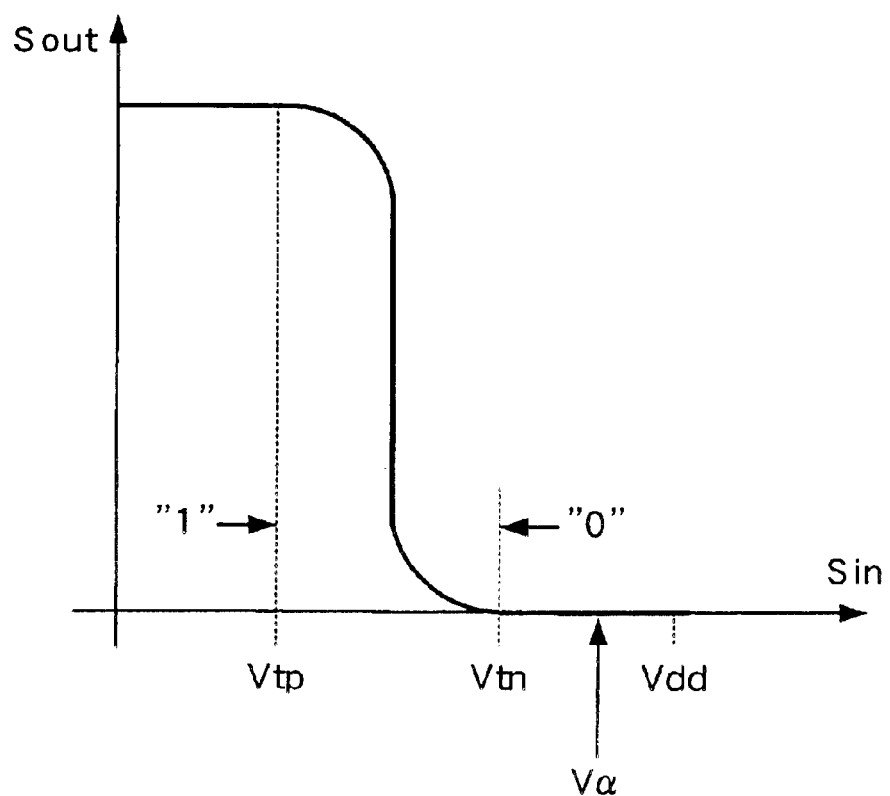

FIGS. 3(a) and 3(b) are respectively a circuit diagram showing only the inverter element of this non-volatile latch circuit and a diagram showing the variation of the output signal with a change in voltage of the input signal. Properties of the inverter element of the present embodiment are explained below.

Here, as shown in FIG. 3(a), it is defined that when input signal Sin is input to floating gate FG, which is a common gate of PMISFET 3 and NMISFET 4, output signal Sout is output from output terminal Tout. As shown in FIG. 3(b), in the range where the voltage of input signal Sin is not greater than threshold voltage Vtp of PMISFET 4, the output signal takes the high logical value "1 (High)," and in the range where the voltage of input signal Sin is not less than threshold Vtn of NMISFET 4, output signal Sout takes the low logical value "0 (Low)." When the voltage of input signal Sin is beyond threshold voltage Vtp of PMISFET 3 and lower than threshold Vtn of NMISFET 4, output signal Sout falls somewhere between the high logical value "1" and low logical value "0." This property is the same as the input-output behavioral characteristics of general inverters. Therefore, in the present embodiment, the latch circuit is designed so that hold voltage $V\alpha$ in floating gate FG becomes not less than threshold voltage Vtn. Output signal Sout from inverter element thereby takes the low logical value "0" with hold electric potential $V\alpha$.

Hereunder, a method for driving a non-volatile latch circuit having the above-described structure is explained.
(A. First Driving Method)

FIG. 4(a) and 4(b) are respectively a timing chart showing the first driving method and a drawing showing the voltage-polarization properties of the ferroelectric film. In FIG. 4(a), period ① is a writing period at high logical value "1," period ② is a reading period at high logical value "1," period ③ is a writing period at low logical value "0," period ④ is a reading period at low logical value "0," and period ⑤ is a reset period.

Period ① and period ② compose a "high-level latch step."

Period ③ and period ④ compose a "low-level latch step."

Period ⑤ composes a "reset step." Generally, substrate 4b of NMISFET 4 is retained at earth electric potential Vss and substrate 3b of PMISFET 3 is retained at supply voltage Vdd. Hereunder, with reference to FIG. 4(a), operation of each period in the first driving method is explained.

① Writing Period at High Logical Value "1"

Period ① corresponds to the "first write substep."

Figure 4:
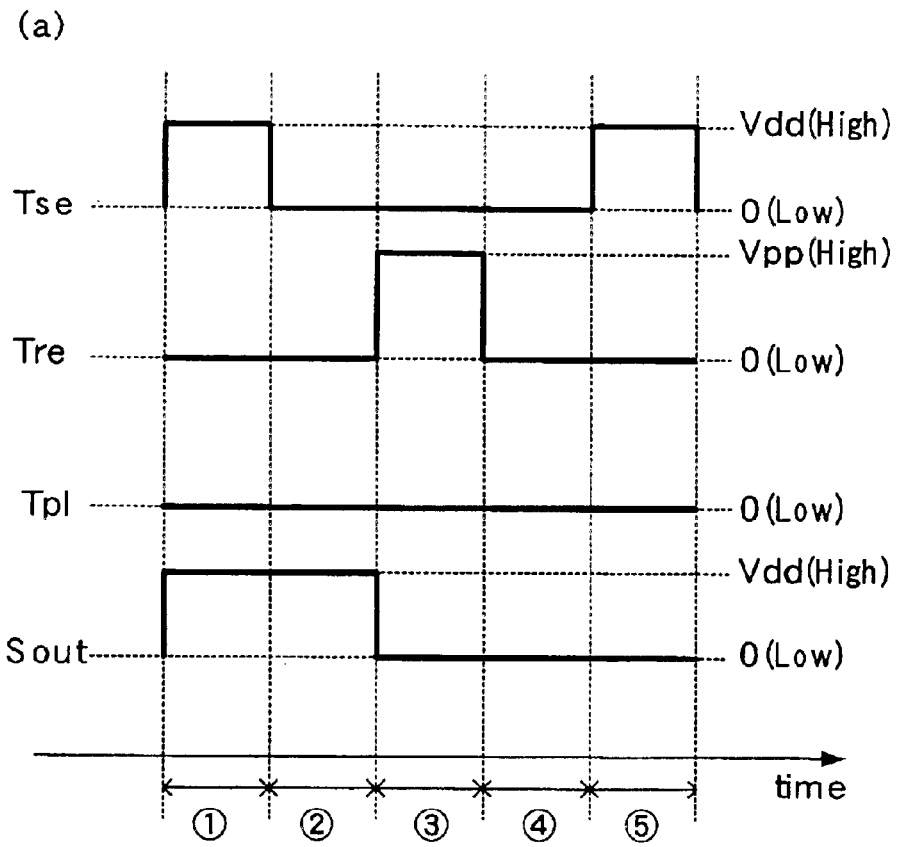
FIG. 4(a) is a timing chart showing a first driving method.
FIG. 4(b) shows the corresponding polarization of the ferroelectric film.
Figure 4:
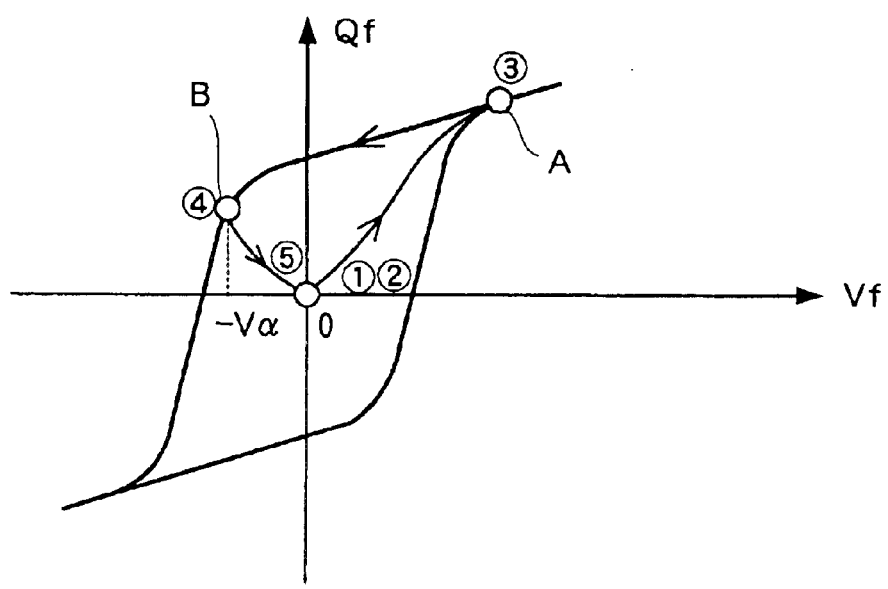

First, the voltages of reset terminal Tre and voltage switching terminal Tpl are set at 0 V (Low). Second, by applying a positive voltage Vdd (High) to set terminal Tse, reset NMISFET 5 is made into an on state. This makes the electric potentials of floating gate FG and input portion A become 0 V. As a result, PMISFET 3 becomes on, and NMISFET 4 becomes off, and output signal Sout from output terminal Tout of inverter element 2 becomes "1," i.e., High (Vdd). In other words, High is output from output portion B. In this case, because the voltage applied to reset terminal Tre is 0 V, the voltage applied to ferroelectric capacitor 1 is 0 V and the amount of polarization is also 0. Therefore, as shown in FIG. 4(*b*), point 0 becomes the operating point of period ①. Note that, here, the embodiment is explained with the proviso that the voltage applied to voltage switching terminal Tpl is 0 V, but the voltage can be varied as long as it is not greater than the threshold of inverter element 2. However, from the viewpoint of making operation of inverter element 2 reliable, it is preferable that the voltage applied to voltage switching terminal Tpl be 0 V. Hereunder, the embodiment is explained with the proviso that the voltage applied to voltage switching terminal Tpl in ① writing period at high logical value "1" is 0 V.

② Reading Period at High Logical Value "1"

Period ② corresponds to the "first read substep."

Here, the voltage of set terminal Tse is returned to 0 V after completion of period ①. Even when the voltage of set terminal Tse is made to 0 V and reset reset NMISFET 5 is made into an off state, because the voltage of reset terminal Tre remains at 0 V, the electric potential of floating gate FG also remains at 0 V (in other words, at an electric potential lower than the threshold voltage of inverter element 2).

Therefore, PMISFET 3 and NMISFET 4 stay in an on and off state respectively, and output signal Sout is also kept at high logical value "1." In this condition, electric potential of floating gate FG in period ② is the same as that in period ①, and therefore the point 0 shown in FIG. 4(*b*) becomes the operating point of period ②.

③ Writing Period at Low Logical Value "0"

Period ③ corresponds to the "second write substep."

Following the completion of period ②, while keeping the voltage of set terminal Tse at 0 V, the voltage of reset terminal Tre is made positive voltage Vpp (High). In this case, because reset NMISFET 5 is kept in an off state, positive voltage Vpp is applied to ferroelectric capacitor 1 and paraelectric capacitor (MIS capacitor) at voltages Vf and Vox, respectively, according to the capacity ratio between ferroelectric capacitor 1 and the MIS capacitors of MISFETs 3 and 4. Therefore, the electric potentials of floating gate FG and input portion A become positive electric potential Vox. Because positive electric potential Vox is not less than threshold voltage Vtp of PMISFET 3 and not less than threshold voltage Vtn of NMISFET 4, PMISFET 3 becomes off and NMISFET 4 becomes on, and output signal Sout of inverter element 2 takes the low logical value "0," i.e., Low (0 V). In other words, Low is output from output portion B. In this case, when voltage Vpp is distributed to ferroelectric capacitor 1 and the paraelectric capacitor, and voltage Vf applied to ferroelectric capacitor 1 becomes satisfactorily high, the polarization of ferroelectric film 1*c* is satisfactorily saturated, and therefore point A shown in FIG. 4(*b*) becomes the operating point of period ③. To make the polarization of ferroelectric film 1*c* satisfactorily saturated as described above, it is preferable that voltage Vpp be set greater than voltage Vdd applied to set terminal Tse.

④ Reading Period at Low Logical Value "0"

Period ④ corresponds to the "second read substep."

After the completion of period ③, while keeping the voltage of set terminal Tse at 0 V, the voltage of reset terminal Tre is returned to 0 V. As described above, because of coupling between ferroelectric capacitor 1 and each MIS capacitor of MISFETs 3 and 4, positive voltage Vα is retained at floating gate FG and input portion A. Because hold voltage Vα is not less than the threshold voltages Vtp and Vtn of PMISFET 3 and NMISFET 4, the off state of PMISFET 3 and the on state of NMISFET 4 are maintained and output signal Sout of inverter element 2 takes the low logical value "0." Here, because the voltage retained by ferroelectric capacitor 1 is Vα, point B shown in FIG. 4(*b*) becomes the operating point of this period.

⑤ Reset Period

As the last step, while applying positive voltage Vdd to set terminal Tse, reset NMISFET 5 is made into an on state. Because the voltage of voltage switching terminal Tpl is 0 V, the electric potential of floating gate FG becomes 0 V. As a result, PMISFET 3 becomes on and NMISFET 4 becomes off, and the output signal takes the high logical value "1," i.e., High (Vdd) In this condition, because the voltage of reset terminal Tre is 0 V, electric charge accumulated by ferroelectric capacitor 1 is removed and the operating condition returns to point 0.

By performing the above-described driving steps, writing followed by reading at high logical value "1 (High)" and low logical value "0 (Low)" becomes possible, and the circuit can function as a latch circuit. In other words, in the present embodiment, the circuit is designed so that input to reset terminal Tre is read in the subsequent period. For example, as shown in FIG. 4(*a*), when input to set terminal Tse in period ① is High, High is read in the next period, i.e., period ②. When input to set terminal Tse in period ③ is Low, Low is read in period ④. When High is input to set terminal Tse in the subsequent period ⑤, it then returns to the initial condition.

In this manner, the circuit shown in FIG. 1 functions as a non-volatile latch circuit. In other words, the circuit shown in FIG. 1 is non-volatile because of ferroelectric capacitor 1. The high-level latch step and low-level latch step are as below:

In the high-level latch step that is composed of period ① and period ②, first, in period ①, 0 V (Low) is input to voltage switching terminal Tpl and positive voltage Vdd (High) is input to set terminal Tse. The "High" signal input to set terminal Tse is output as "High" from output portion B in period ②. Note that, in period ①, the voltage applied to reset terminal Tre may be varied; however, from the point of view of not affecting inverter element 2, it is preferable that the voltage applied to reset terminal Tre be the same voltage as that of switching terminal Tpl (preferably 0 V).

In the low-level latch step that is composed of period ③ and period ④, in period ③, 0 V (Low) is input to set terminal Tse. The "Low" signal that has been input to set terminal Tse is output as "Low" from output portion B in the subsequent period, i.e., period ④. In this manner the circuit shown in FIG. 1 functions as a non-volatile latch circuit. In the present invention, the electric potentials of floating gate FG and input portion A in period ③ wherein positive voltage Vpp (High) is input to reset terminal Tre must be greater than the threshold of inverter element 2, and the electric potentials of floating gate FG and input portion A also must be greater than the threshold of inverter element 2 in period ④ wherein 0 V (Low) is input to reset terminal Tre. In order to meet this requirement, it is necessary, when Low (0 V) is applied to reset terminal Tre after applying Vpp (High) under the condition where switching element 5 is made in an off state (period ②–period ④), the voltage generated in second electrode 1*b*, floating gate FG, and input portion A attributable to polarization remaining in ferroelectric film 1c be higher than the threshold of inverter element 2.

FIG. 4(a) shows the case where a voltage is applied to set terminal Tse in the order High-Low, i.e., periods ①–⑤ are driven in that order; however, other ways of driving can of course be employed. For example, when High is continuously input to set terminal Tse, this switching, element repeats drives of periods ① and ②. In contrast, when Low is continuously input to set terminal Tse, it repeats drives of periods ③ to ⑤. When a voltage is input to set terminal Tse in the order Low-High, the drives of periods ① and ② are added after the drives of periods ③ to ⑤.

In the present embodiment, as shown in periods ② and ④, because it is possible to read at high logical value "1" and low logical value "0" without another additional voltage, the number of voltage applications to ferroelectric film 1c is reduced and deterioration of ferroelectric properties can be prevented. Furthermore, with this driving method, because only the upper half of the hysteresis loop (positive polarization) of ferroelectric capacitor 1 is used and polarization is not inverted, it is possible to improve the fatigue properties of ferroelectric film 1c. Furthermore, with this driving method, the distinction between high logical value "1" and low logical value "0" is detectable by the output electric potential of the inverter element, and so detection is simpler than detection by using a sense amplifier.

(B. Second Driving Method)

Figure 5:
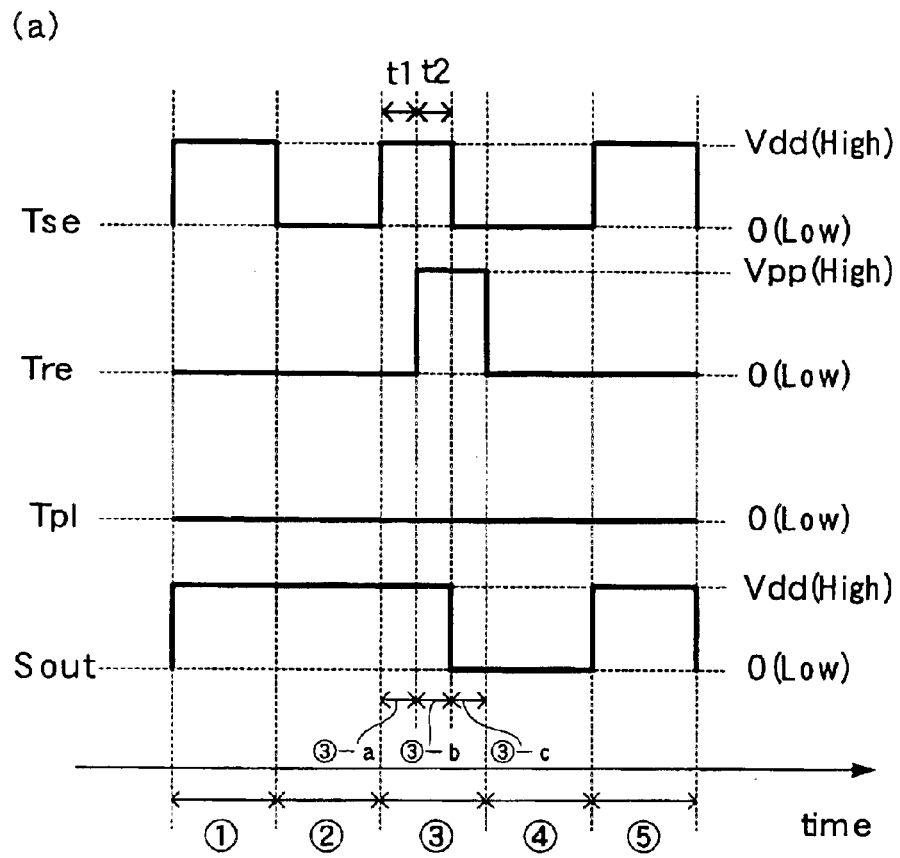
FIG. 5(a) is a timing chart showing a second driving method.
FIG. 5(b) shows the corresponding polarization of the ferroelectric film.
Figure 5:
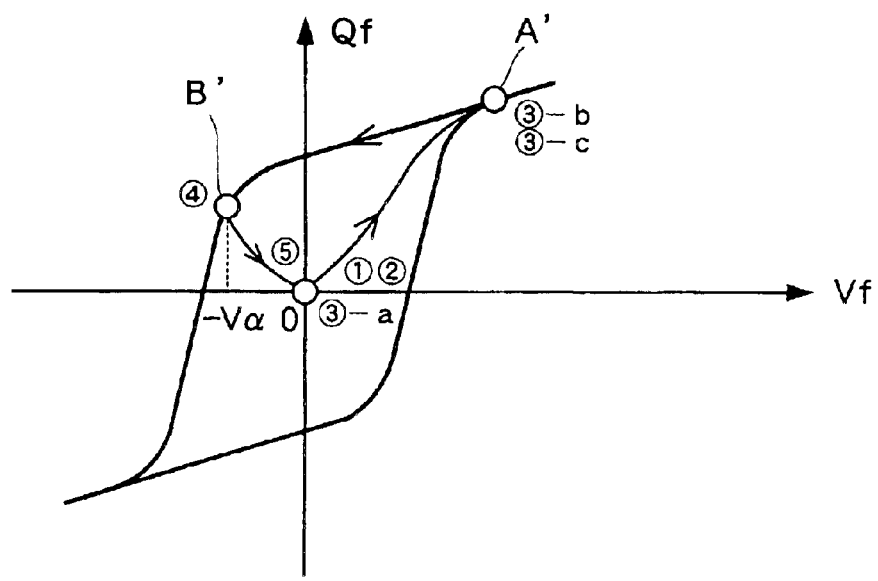

FIGS. 5(a) and 5(b) are respectively a timing chart showing the second driving method, and diagram showing the voltage-polarization properties of the ferroelectric film. In FIG. 5(a), period ① is a writing period at high logical value "1," period ② is a reading period at high logical value "1," period ③ is a writing period at low logical value "0, " period ④ is a reading period at low logical value "0," and period ⑤ is a reset period. Hereunder, with reference to FIG. 5(a), operation of each period in the second driving method is explained below.

① Writing Period at High Logical Value "1"

As in the first driving method, by applying positive voltage Vdd (High) to set terminal Tse, reset NMISFET 5 is made into an on state. Accordingly, because the voltage of voltage switching terminal Tpl is 0 V, electric potential of floating gate FG becomes 0 V. As a result, PMISFET 3 becomes on, NMISFET 4 becomes off, and output signal Sout from output terminal Tout of the inverter element becomes "1," i.e., High (Vdd). Because the voltage applied to ferroelectric capacitor 1 is 0 V and the amount of polarization is also 0, as shown in FIG. 5(b), point 0 becomes the operating point of period ①.

② Reading Period at High Logical Value "1"

The voltage of set terminal Tse is then returned to 0 V (Low) and reset NMISFET 5 is made into an off state. Because the voltage of reset terminal Tre is kept at 0 V, the electric potential of floating gate FG is 0 V. Therefore, PMISFET 3 and NMISFET 4 stay in an on and off state respectively, and output signal Sout remains at high logical value "1." Because electric potential of floating gate FG in period ② is the same as in period ①, point 0 shown in FIG. 5(b) becomes the operating point of period ②.

③ Writing Period at Low Logical Value "0"

First, the voltage of set terminal Tse is set at positive voltage Vdd (High) and reset NMISFET 5 is made into an on state (period ③-a). This makes the electric potential of floating gate FG 0 V. Second, when time t1 has passed since application of voltage Vdd to set terminal Tse, the voltage of reset terminal Tre is made to be positive voltage Vpp, which is higher than voltage Vdd (period ③-b). At this time, because the voltage of voltage switching terminal Tpl is 0 V and reset NMISFET 5 is in an on state, the electric potential of floating gate FG becomes 0 V. Therefore, voltage Vpp of reset terminal Tre becomes the voltage to be applied to ferroelectric capacitor 1. In this case, unlike the above-described first driving method, because the voltage of voltage switching terminal Tpl is 0 V and reset NMISFET 5 is on, a voltage is not applied to gate insulating films 3i and 4i of the inverter element. Because a voltage is not distributed to gate insulating films 3i and 4i of the inverter element, even when the voltage applied to ferroelectric capacitor 1 is relatively low, polarization of ferroelectric film 1c is satisfactorily saturated. The operating point at this time is A' shown in FIG. 5(b). In periods ③-a and ③-b, since the electric potential of floating gate FG is 0 V, PMISFET 3 becomes on, NMISFET 4 becomes off, and output signal Sout of inverter element takes the high logical value "1," i.e., High (Vdd).

When time t2 has passed since positive voltage Vpp is applied to reset terminal Tre, the voltage of set terminal Tse is returned to 0 V. This makes reset NMISFET 5 off, and therefore the electric potential of floating gate FG becomes positive electric potential Vox. Because positive electric potential Vox is not less than threshold voltages Vtp and Vtn of P MISFET 3 and NMISFET 4, PMISFET 3 becomes off, NMISFET 4 becomes on, and output signal Sout of the inverter element takes the low logical value "0," i.e., Low (0 V) (period ③-c). The operating point at this time is the same as that in the above-described period ③-b, which is point A'.

④ Reading Period at Low Logical Value "0"

Next, the voltage of reset terminal Tre is returned to 0 V. As described above, because of coupling between ferroelectric capacitor 1 and each MIS capacitor of MISFETs 3 and 4, positive voltage Vα is maintained in floating gate FG. Because hold voltage Vα is not less than threshold voltages Vtp and Vtn of PMISFET 3 and NMISFET 4, PMISFET 3 becomes off, NMISFET 4 becomes on, and output signal Sout of inverter element takes the low logical value "0." At this time, since the voltage retained by ferroelectric capacitor 1 is Vα, point B' shown in FIG. 5(b) becomes the operating point in this period.

⑤ Reset Period

As the last step, positive voltage Vdd is applied to set terminal Tse and turns reset NMISFET 5 on. Here, because the voltage of voltage switching terminal Tpl is 0 V, the electric potential of floating gate FG becomes 0 V. As a result, PMISFET 3 becomes on, NMISFET 4 becomes off, and output signal takes the high logical value "1," i.e., High (Vdd). Here, because the voltage of reset terminal Tre is 0 V, the electric charge accumulated in ferroelectric film capacitor 1 is removed and the operating condition is returned to point 0 as shown in FIG. 5(b).

By repeating the above-described drives, as with the first driving method, writing at high logical value "1" and low logical value "0" and subsequent reading becomes possible, and the circuit can function as a latch circuit. In other words, when input to set terminal Tse in period ① is High, High is read in period ②, and when input to set terminal Tse is Low in period (③-c, Low is read in period ④. Because reading is possible in periods ② and ③ without applying additional voltage, the number of voltage applications to ferroelectric film 1c is decreased and deterioration of ferroelectric properties can be prevented.

Furthermore, unlike the first driving method, when a voltage is applied to ferroelectric capacitor 1 in period ③-b, because the electric potential of floating gate FG is made 0 V to prevent a voltage being applied to the paraelectric capacitor, the voltage applied to reset terminal Tre is applied to ferroelectric film 1c unchanged. This is advantageous in that the voltage during writing can be reduced compared to that in the first driving method, since a voltage is not distributed to each MISFET capacitor in the inverter element.

(C. Third Driving Method)

Figure 6:
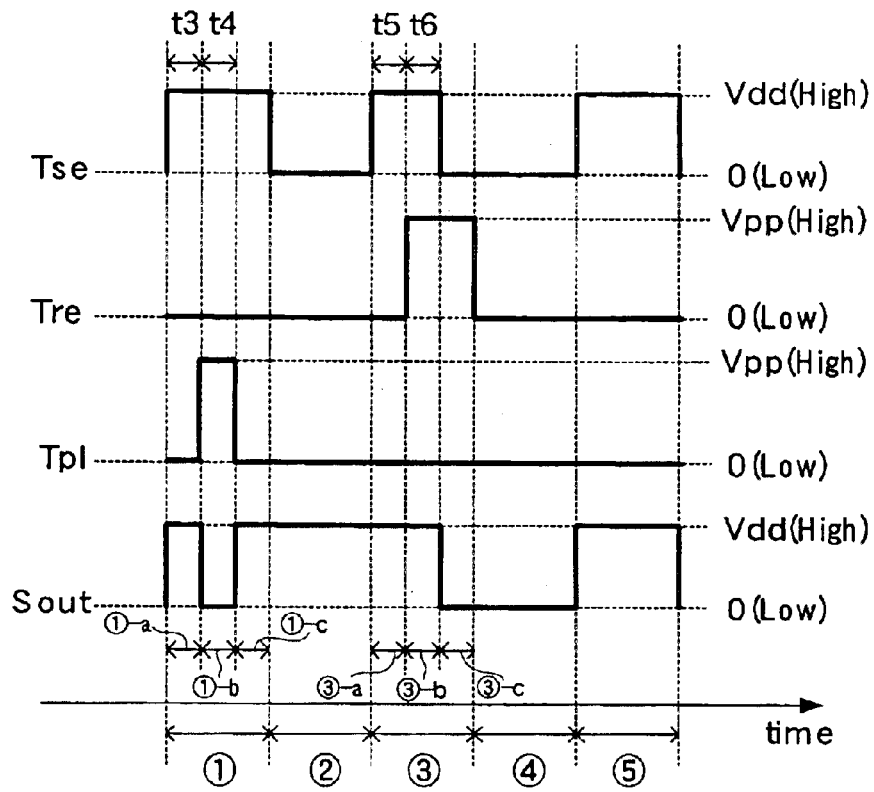
FIG. 6(a) is a timing chart showing a third driving method.
FIG. 6(b) shows the corresponding polarization of the ferroelectric film.
Figure 6:
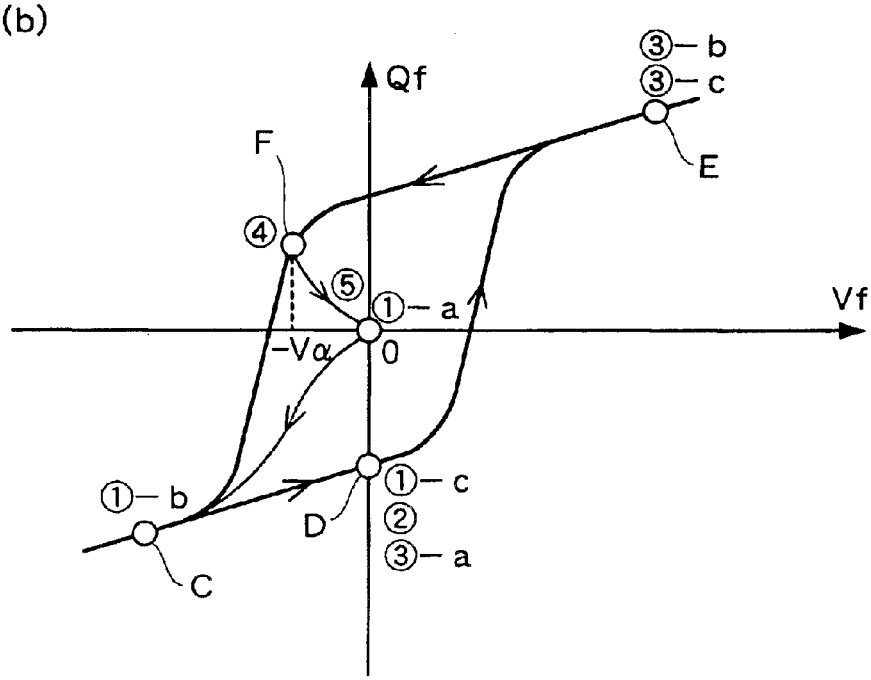

FIGS. 6(a) and 6(b) are a timing chart showing the third driving method and a diagram showing the voltage-polarization properties of the ferroelectric film. In FIG. 6(a), period ① is a writing period at high logical value "1," period ② is a reading period at high logical value "1," period ③ is a writing period at low logical value "0," period ④ is a reading period at low logical value "0," and period ⑤ is a reset period. Hereunder, operation of each period in the third driving method will be explained with reference to FIG. 6(a).

① Writing Period at High Logical Value "1"

First, while applying positive voltage Vdd to set terminal Tse, reset NMISFET 5 is made into an on state. Since the voltage of voltage switching terminal Tpl is 0 V, the electric potential of floating gate FG becomes 0 V. As a result, PMISFET 3 becomes on, NMISFET 4 becomes off, and output signal Sout from output terminal Tout of inverter element becomes "1," i.e., High (Vdd) (period ①-a). Here, the voltage applied to ferroelectric capacitor 1 is 0 V and the amount of polarization is also 0, and therefore as shown in FIG. 6(b), point 0 becomes the operating point of period ①.

Subsequently, when time t3 has passed since application of positive voltage Vdd to set terminal Tse, the voltage of voltage switching terminal Tpl is changed from 0 V (Low) to positive voltage Vpp (High). Because the voltage of reset terminal Tre is maintained at 0 V (Low) from the beginning, the voltage applied to ferroelectric film 1c is changed from 0 V to -Vpp, and polarization in the negative direction is induced. Therefore, the operating point shown in FIG. 6(b) will be shifted from point 0 to point C. At this time, because the electric potential of floating gate FG becomes a positive electric potential Vpp, which is higher than threshold voltages Vtp and Vtn of PMISFET 3 and NMISFET 4, PMISFET 3 becomes off, NMISFET 4 becomes on, and output signal Sout of the inverter element takes the low logical value "0," i.e., Low (0 V) (period ①-b).

Subsequently, when time t4 has passed since application of positive voltage Vpp to voltage switching terminal Tpl, the applied voltage is returned to 0 V. Because this makes the electric potential of floating gate FG 0 V, PMISFET 3 turns on, NMISFET 4 turns off, and output signal Sout from output terminal Tout of the inverter element becomes "1." Since the voltage applied to ferroelectric film 1c changes from -Vpp to 0 V, the operating point shifts from point C to point D in FIG. 6(b) (period ①-c).

② Reading Period at High Logical Value "1"

As the next step, the voltage of set terminal Tse is returned to 0 V. Even when the voltage of set terminal Tse is made 0 V and reset NMISFET 5 is turned off, because the voltage of reset terminal Tre remains at 0 V, the electric potential of floating gate FG also remains at 0 V. Therefore, PMISFET 3 is maintained in an on state, NMISFET 4 is maintained in an off state, and output signal Sout is maintained at high logical value "1," i.e., High (Vdd). In this case, the electric potential of floating gate FG in period ② is the same as that of period ①-c, and therefore point D shown in FIG. 6(b) becomes the operating point in period ②.

③ Writing Period at Low Logical Value "0"

Driving in this period is performed in the same manner as that in period ③ of the second driving method. The voltage of set terminal Tse is made positive voltage Vdd and reset NMISFET 5 is turned on (period ③-a). In this case, the electric potential of floating gate FG becomes 0 V. Here, the operating point remains at point D shown in FIG. 6(b).

When time t5 has passed since application of positive voltage Vdd to set terminal Tse, the voltage of reset terminal Tre is made positive voltage Vpp, which is higher than voltage Vdd (period ③-b). Because the electric potential of floating gate FG is 0 V, the voltage applied to ferroelectric capacitor 1 becomes Vpp, and as shown in FIG. 6(b), its operating point shifts from point D to point E. In this case, voltage of switching terminal Tpl is 0 V, reset NMISFET 5 is on, and a voltage is not distributed to gate insulating films 3i and 4i in the inverter element, so even when the voltage applied to ferroelectric capacitor 1 is relatively weak, polarization of ferroelectric film 1c is satisfactorily saturated. In periods ③-a and ③-b, because the electric potential of floating gate FG is 0 V, PMISFET 3 becomes on, NMISFET 4 becomes off, and output signal Sout of inverter element takes the high logical value "1."

When time t6 has passed since application of positive voltage Vpp to reset terminal Tre, the voltage of set terminal Tse is returned to 0 V. The electric potential of floating gate FG thereby becomes positive electric potential Vox. Positive electric potential Vox is higher than threshold voltages Vtp and Vtn of PMISFET 3 and NMISFET 4, and therefore PMISFET 3 becomes on, NMISFET 4 becomes off, and output signal Sout from the inverter element takes the low logical value "0," i.e., Low (0 V)(period ③-c). In this case, the operating point is the same as in period ③-b, which is point E.

④ Reading Period at Low Logical Value "0"

Next, the voltage of reset terminal Tre is returned to 0 V. As described above, because of coupling between ferroelectric capacitor 1 and each MIS capacitor of MISFETs 3 and 4, positive voltage Vα is retained by floating gate FG. Because hold voltage Vα is higher than threshold voltages Vtp and Vtn, PMISFET 3 becomes off, NMISFET 4 becomes on, and output signal Sout from the inverter element takes the low logical value "0 (Low)." Here, the voltage retained by ferroelectric capacitor 1 is Vα, and therefore point F shown in FIG. 6(b) becomes the operating point in this period.

⑤ Reset Period

As the last step, while applying positive voltage Vdd to set terminal Tse, reset NMISFET 5 is made into an on state. Because this makes the voltage of voltage switching terminal Tpl 0 V, the electric potential of floating gate FG becomes 0 V. As the result, electric charge accumulated by ferroelectric film capacitor 1 is removed, and therefore as shown in FIG. 6(b), the operating condition returns to point 0. At this time, PMISFET 3 becomes on, NMISFET 4 becomes off, and output signal Sout takes the high logical value "1 (High)."

By performing the above drives, it is possible to achieve the effects described in the first and second driving methods. Furthermore, in the third driving method, in the step of writing at high logical value "1" in period ①, polarization in the direction opposite to that in writing at low logical value "0" is induced, and not only the upper half but also the lower half of the hysteresis loop of the ferroelectric capacitor is used. As described above, by providing a step for inverting polarization of ferroelectric film 1c, the electric charge accumulated in floating gate FG can be removed, keeping the hold voltage in a stable condition. Furthermore, this makes it possible to prevent hysteresis properties from changing and normal operation can be maintained. Note that also in this driving method, the switching element is designed so that the same logical value input in set terminal Tse is read in the next period, and it is possible to make the switching element function as a latch circuit.

As described above, in the non-volatile latch circuit of the present embodiment, writing at high logical value and low logical value and subsequent reading is possible by employing the above-described driving method and thereby the circuit functions as a latch circuit. Furthermore, because it is possible to read or write high logical value "1" and low logical value "0" without applying additional voltage, the number of voltage applications to ferroelectric film 1c is reduced and deterioration of ferroelectric properties can be prevented.

In the non-volatile latch circuit of the present embodiment, because, as an inverter element, a CMOS inverter element is used, it has the following advantages. That is, in the present embodiment, because the capacity Cc of the paraelectric capacitor is determined by the total area of gate insulating films 3i and 4i of PMISFET 3 and NMISFET 4 that are connected in parallel to each other, capacity Cc of the paraelectric capacitor becomes larger than conventional MFMIS structures. Therefore, the ratio of the voltage distributed to ferroelectric capacitor 1 relative to the voltage applied across substrates 3b and 4b of MISFETs 3 and 4 and reset terminal Tre becomes larger than in a conventional MFMIS structure. As a result, it becomes possible to drive a latch circuit at low voltage. Furthermore, hold voltage Vα can be readily made high, improving the accuracy of reading.

Example of semiconductor integrated circuits employing non-volatile latch circuit 10 are explained below.

Second Embodiment

Figure 7:
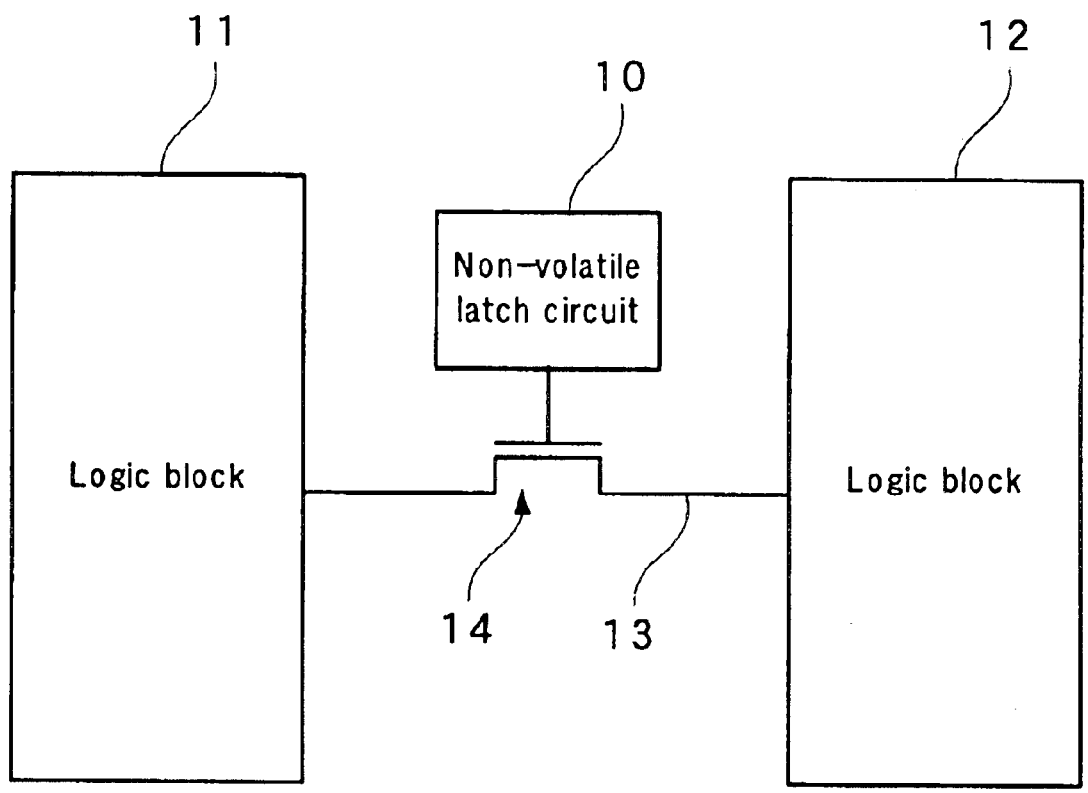
FIG. 7 is a block diagram showing the structure of a semiconductor integrated circuit according to the second embodiment of the invention.

FIG. 7 is a block diagram showing the structure of the semiconductor integrated circuit of the second embodiment of the invention.

As shown in this diagram, the semiconductor integrated circuit of the present embodiment comprises two logic blocks 11 and 12. These integrate a great many logic transistors, etc. Logic blocks 11 and 12 are connected to each other by wiring 13 via pass-transistor 14 (NMISFET). Non-volatile latch circuit 10 described in the first embodiment is connected to pass-transistor 14. Output signal Sout of non-volatile latch circuit 10 is applied to the gate of pass-transistor 14 in such a manner that the on- or off-state of pass-transistor 14 can be controlled.

Because the on- or off-state of pass-transistor 14 that is disposed between logic blocks 11 and 12 is controlled by output signal Sout of non-volatile latch circuit 10 in the above-described structure, when power supply is restored after power supply to the entire semiconductor integrated circuit is cut, the logical value of output signal Sout of non-volatile latch circuit 10 can be maintained at the level immediately before cutting the power supply.

In other words, when output signal Sout of non-volatile latch circuit 10 immediate before cutting power supply is low logical value "0," output signal Sout of non-volatile latch circuit 10 when power supply is restored is also low logical value "0," and signals cannot be transmitted across logic blocks 11 and 12. In contrast, when output signal Sout of non-volatile latch circuit 10 immediate before cutting power supply is high logical value "1," output signal Sout of non-volatile latch circuit 10, when power supply is restored, is also high logical value "1," and signals can be transmitted across logic blocks 11 and 12. Therefore, it is possible to reduce power consumption and make circuit operation faster.

The semiconductor integrated circuit of the present embodiment can be employed in a reconfigurable circuit.

The reconfigurable circuit is so designed that rewriting accompanying change in specification of a circuit is possible even after fabrication of a semiconductor integrated circuit (LSI). In this circuit, it is possible to shorten the duration of time needed from designing of the circuit to verification of operation, and verification of operation can readily be fed back to the circuit design in a short time. Examples of such circuits include FPGAs (Filed Programmable Gate Arrays). FPGAs use a multiplexer or lookup table as a program element to switch logics. There are two types of FPGAs, i.e., the RAM-type, which uses an EPROM or an EEPROM for storing the program, and the high-speed-type, which uses a Fuse or an Anti-Fuse.

In recent years, SRAM-type latch circuits that are rewritable and operate at high speed have been used. Heretofore used SRAM-type latch circuits can rewrite data by maintaining the output at a certain value while power is supplied; however, when power supply is removed, they cannot retain information because they are volatile. Furthermore, because they use at least 5 transistors, they occupy a lot of space. In conventional SRAM-based FPGAs, information recorded in the SRAM-type latch circuit is transferred to the EEPROM or the other non-volatile memory circuit before removing power supply and the recorded information is transferred from the non-volatile memory circuit to each SRAM-type latch circuit when power is resupplied. Therefore, they are disadvantageous in that, when power supply is restored, they take time for the SRAM-type latch circuit to return to the condition before removal of power supply.

In contrast, in the semiconductor integrated circuit of the present embodiment, because each latch circuit is non-volatile, it is not necessary to transfer recorded information from other memory circuits when power supply is returned after removing it, and therefore quick circuit recovery is possible when power is resupplied.

Figure 8:
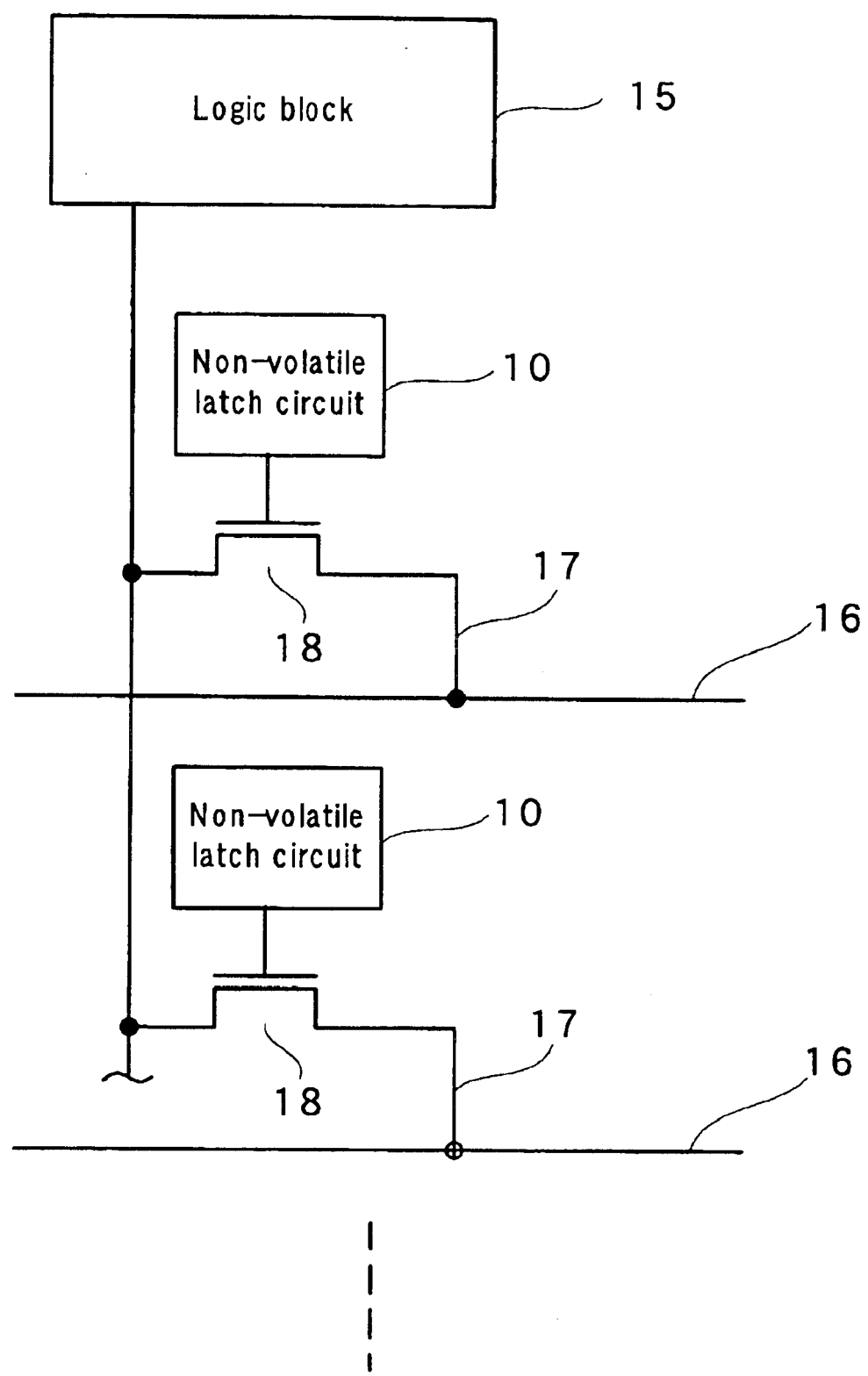
FIG. 8 is a block diagram showing another structure of a semiconductor integrated circuit according to the second embodiment of the invention.

One non-volatile latch circuit is used in the above-described semiconductor integrated circuit; however, it is also possible to form a semiconductor integrated circuit as shown in FIG. 8 using a plurality of non-volatile latch circuits. As shown in this diagram, this semiconductor integrated circuit comprises logic block 15, a great many wirings 16 that are connected to other logic blocks or memory circuits (not shown), and branched wiring 17 connecting wiring 16 with logic block 15 wherein each branched wiring 17 is provided with pass-transistor 18. Each pass-transistor 18 is connected to a non-volatile latch circuit 10 described in the first embodiment. Output signal Sout of non-volatile latch circuit 10 is applied to the gate of pass-transistor 18 in such a manner that the on- or off- state of pass-transistor 18 is controlled.

In the above example, non-volatile latch circuit 10 is employed in a semiconductor integrated circuit in which the wiring through which output signal from logic block 15 is supplied can be switched as in a decoder circuit in a memory. This structure makes it possible to maintain the logical value of output signal Sout of non-volatile latch circuit 10 at the condition immediately before removing the power when power supply to the entire semiconductor integrated circuit is removed and then returned. Therefore, it achieves reduction of power consumption and high-speed circuit operation.

Third Embodiment

Figure 9:
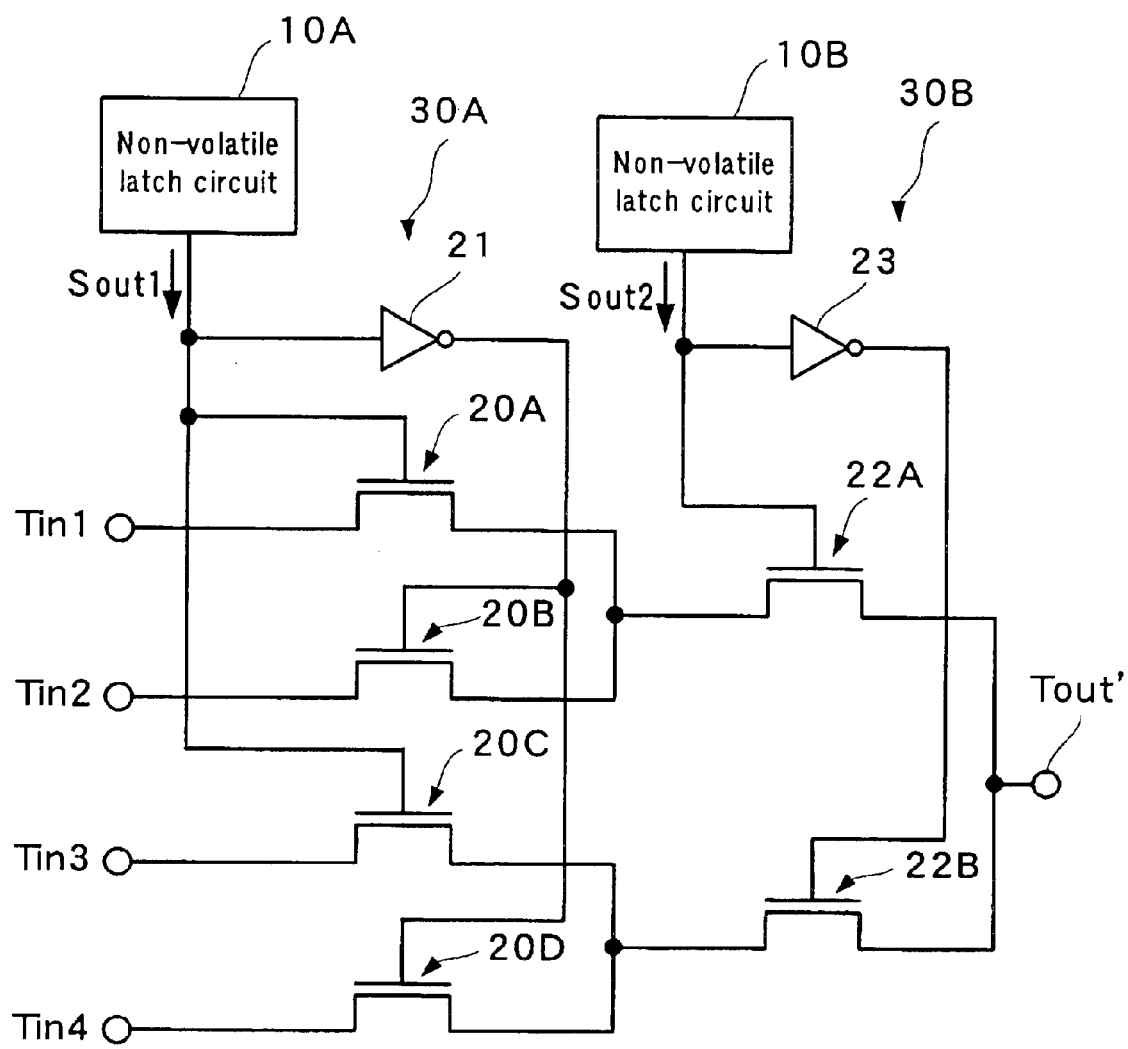
FIG. 9 is a block diagram showing the structure of a semiconductor integrated circuit according to the third embodiment of the invention.

FIG. 9 is a block diagram showing the structure of the semiconductor integrated circuit of the third embodiment of the invention. As shown in this figure, the semiconductor integrated circuit of this embodiment is a 4-input multiplexer circuit, which comprises four input terminals Tin 1–Tin 4 and one output terminal Tout', the circuit being designed so that one of input signals from input terminals Tin 1–Tin 4 is selected by two-step select circuits 30A and 30B and output from output terminal Tout'. First select circuit 30A comprises non-volatile latch circuit 10A of the first embodiment, four pass-transistors 20A–20D that receive input signals from input terminals Tin 1–Tin 4, respectively, and inverter 21 that inverts output from non-volatile latch circuit 10A.

The gate of pass-transistor 20A, which is one of two pass-transistors 20A and 20B that receive input from input terminals Tin 1 and Tin 2, receives output signal Sout 1 from non-volatile latch circuit 10A. The gate of the other pass-transistor 20B receives the inverted signal of output signal Sout 1 through inverter 21. The gate of pass-transistor 20C, which is one of two pass-transistors 20C and 20D that receive input from input terminals Tin 3 and Tin 4, receives output signal Sout 1 from non-volatile latch circuit 10A. The gate of the other pass-transistor 20D receives the inverted signal of output signal Sout 1 through inverter 21.

Second select circuit 30B comprises non-volatile latch circuit 10B of the first embodiment, pass-transisitor 22A that receives output from pass-transistors 20A and 20B, pass-transistor 22B that receives output from pass-transistors 20C and 20D, and inverter 23 for inverting output from non-volatile latch circuit 10B. The gate of pass-transistor 22A, which is one of two pass-transistors transistors 22A and 22B, receives output signal Sout 2 from non-volatile latch circuit 10B and the gate of pass-transistor 22B, which is the other pass-transistor, receives the inverted signal from output signal Sout 2 through inverter 23.

In the present embodiment it is also possible to control the input and output relationship of multiplexer circuit by output signals Sout 1 and Sout 2 of non-volatile latch circuits 10A and 10B. Therefore, when power supply is restored after power supply to the entire semiconductor integrated circuit is cut, logical values of output signals Sout 1 and Sout 2 are maintained in the condition immediately before the power supply to non-volatile latch circuits 10A and 10B was removed. Accordingly, power consumption reduction and high speed operation of circuit become possible.

Fourth Embodiment

Figure 10:
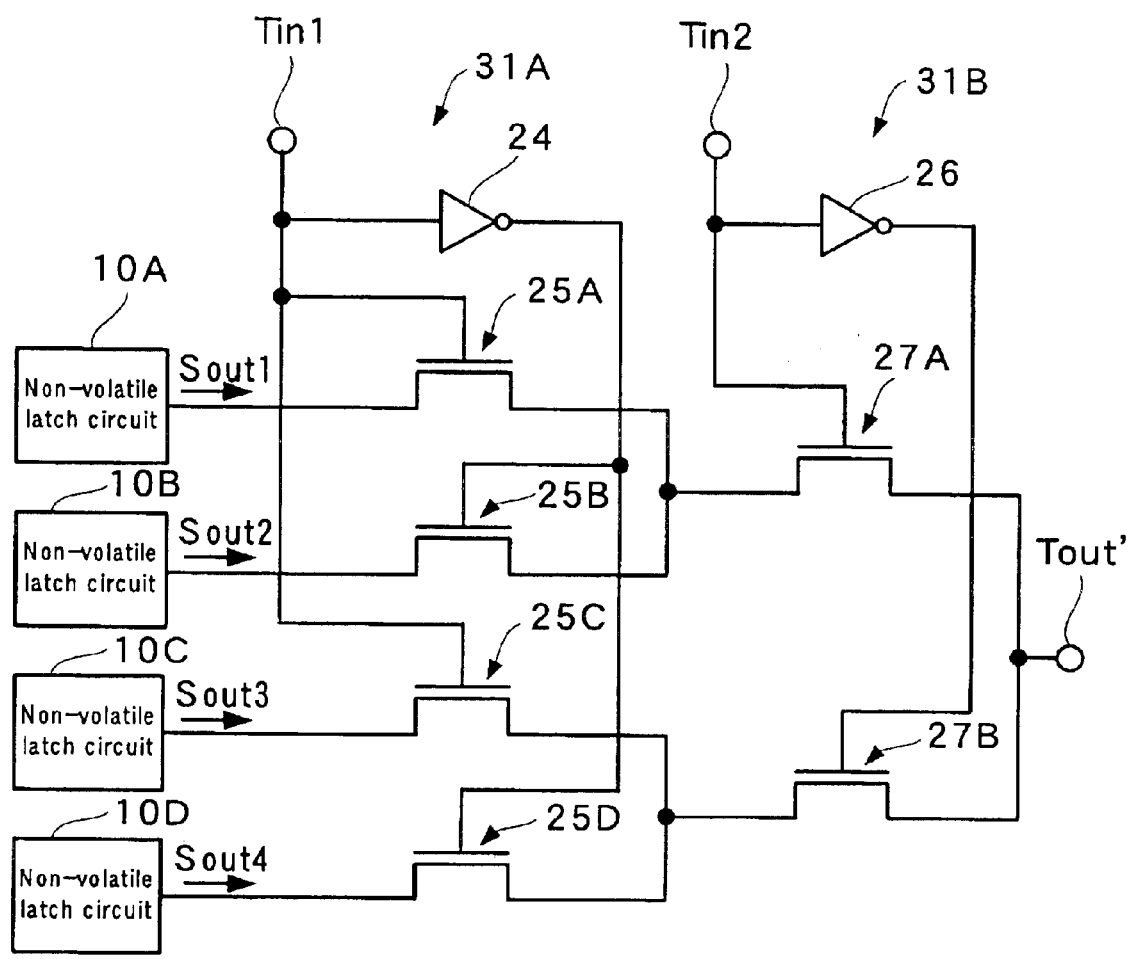
FIG. 10 is a block diagram showing the structure of a semiconductor integrated circuit according to the fourth embodiment of the invention.

FIG. 10 is a block diagram showing the structure of the semiconductor integrated circuit of the fourth embodiment of the invention. As shown in this figure, the semiconductor integrated circuit of this embodiment is 2-input lookup table circuit, which comprises two input terminals Tin 1 and Tin 2, four non-volatile latch circuits 10A–10D having the structure of the first embodiment, and one output terminal Tout'. The circuit is designed so that one of output signals Sout 1–Sout 4 is selected by two-step select circuits 31A and 31B and output from output terminal Tout'. First select circuit 31A comprises four pass-transistors 25A–25D that receive output signals Sout 1–Sout 4 from non-volatile latch circuits 10A–10D respectively, and inverter 24 that inverts input signals from input terminal Tin 1.

The gate-of pass-transistor 25A, which is one of the two pass-transistors 25A and 25B that receive output signals Sout 1 and Sout 2 from two non-volatile latch circuits 10A and 10B, receives input signal from input terminal Tin 1, and the gate of the other pass-transistor 25B receives inverted input signals through inverter 24. The gate of pass-transistor 25C, which is one of two pass-transistors 25C and 25D that receive output signals Sout 3 and Sout 4 from non-volatile latch circuits 10C and 10D, receives input signals from input terminal Tin 1, and the gate of pass-transistor 25D receives inverted input signals through inverter 24.

Second select circuit 31B comprises input terminal Tin 2, pass-transistor 27A that receives output from pass-transistors 25A and 25B, pass-transistor 27B that receives output from pass-transistors 25C and 25D, and inverter 26 that inverts input signal from input terminal Tin 2. The gate of pass-transistor 27A, which is one of two pass-transistors 27A and 27B, receives input signal from input terminal Tin 2, and the gate of pass-transistor 27B, which is the other pass-transistor, receives inverted input signals through inverter 26.

The lookup table circuit of the present embodiment can be used to switch between 16 types of Boolean logics in accordance with output signals Sout 1–Sout 4 of non-volatile latch circuits 10A–10D. When power supply is restored after power supply to the entire semiconductor integrated circuit is removed, because the logical values of output signals Sout 1–Sout 4 of non-volatile latch circuits 10A–10D are maintained at the level immediately prior to cutting the power supply, information recorded in the lookup table circuit is maintained at the condition immediately prior to cutting the power supply. Therefore, as in the second and third embodiments, reduction of power consumption and operation of circuit at high speed become possible.

Some embodiments of the present invention are explained above; however, the present invention is not limited to these embodiments and modifications can be made as long as they do not depart from the scope of the invention. For example, in the above embodiments, the inverter element is composed of a CMOS comprising a PMISFET and an NMISFET; however, possible embodiments are not limited to this. Instead of PMISFET 3, other types of switching element can be used as long as they become off when input portion A is High and become on when it is Low. Similarly, instead of NMISFET 4, other types of switching elements can be used as long as they become on when input portion A is High and become off when it is Low. Known types can be used as an inverter element. For example, the inverter element of the present invention can be obtained by connecting resistance to a transistor.

In the above embodiments, reset NMISFET 5 is used as a switching element; however, other types can be used as a switching element of the present invention and there is no limitation to the switching elements as long as they can switch the voltage applied to the second electrode of the ferroelectric capacitor.

Furthermore, Y1 is used as a material for ferroelectric capacitors in the above embodiments; however, other ferroelectric materials, such as bismuth titanate and lead titanate can be used as long as they have polarization hysteresis properties. It is also possible to use high polymer compounds, such as polyvinylidenfluoride/trifluoroethylene copolymer (P(VDF/TrFE)), etc., which retain data using polarization of electric charges.

Industrial Applicability

The present invention provides a non-volatile latch circuit that-can reduce the number of voltage applications to a ferroelectric film required in writing or reading information and prevent deterioration of ferroelectric properties, and a method for driving the same.

What is claimed is:

1. A non-volatile latch circuit comprising:
a ferroelectric capacitor having a first electrode, a second electrode, and a ferroelectric film disposed between the first electrode and the second electrode;
a first input terminal for applying a voltage to the first electrode;

an inverter element having an input portion and an output portion, the input portion being connected to the second electrode of the ferroelectric capacitor;

a second input terminal for applying a voltage to the second electrode;

a switching element connected between the second electrode and the second input terminal for switching the voltage applied to the second electrode; and a third input terminal for applying a voltage to the switching element to change the on/off-state thereof;

the inverter element outputting a high-level voltage to the output portion when a low-level voltage, which is lower than the threshold of the inverter element, is applied to the input portion thereof, and outputting a low-level voltage to the output portion when a high-level voltage, which is higher than the threshold of the inverter element, is applied to the input portion thereof;

the voltage that is generated at the second electrode by residual polarization in the ferroelectric film being higher than the threshold voltage of the inverter element when the voltage is applied to the first input terminal and the switching element is turned off.

2. A non-volatile latch circuit according to claim 1,
wherein the inverter element is composed of a complementary MOS inverter element comprising a first MISFET and a second MISFET;

the first MISFET comprises a first gate electrode, a first gate insulating film, a first source region, and a first drain region;

the second MISFET comprises a second gate electrode, a second gate insulating film, a second source region, and a second drain region;

the first gate electrode and the second gate electrode are connected to the input portion;

the first drain region and the second drain region are connected to the output portion;

a voltage is applied to the first source region in such a manner that the first source region has a high potential;

a voltage is applied to the second source region in such a manner that the second source region has a low potential;

the first MISFET is turned on when a low-level voltage, which is lower than the threshold of the inverter element, is applied to the input portion, and turned off when a high-level voltage, which is higher than the threshold of the inverter element, is applied to the input portion, and the second MISFET is turned on when a high-level voltage, which is higher than threshold of the inverter element, is applied to the input portion, and turned off when a low-level voltage, which is lower than the threshold of the inverter element, is applied to the input portion.

3. A non-volatile latch circuit according to claim 2, wherein the threshold voltage of the second MISFET is the threshold voltage of the inverter element.

4. A non-volatile latch circuit according to claim 2, wherein the first MISFET is p-type and the second MISFET is n-type.

5. A non-volatile latch circuit according to claim 2, wherein the voltage that makes the first source region high potential is positive supply voltage.

6. A non-volatile latch circuit according to claim 2, wherein the voltage that makes the second source region low potential is earth voltage.

7. A non-volatile latch circuit according to claim 1, wherein the low-level voltage, which is lower than the threshold of the inverter element, is an earth voltage.

8. A non-volatile latch circuit according to claim 1, wherein the ferroelectric film is formed of strontium bismuth tantalate.

9. A method for driving a non-volatile latch circuit that comprises:

a ferroelectric capacitor having a first electrode, a second electrode, and a ferroelectric film disposed between the first electrode and the second electrode;

a first input terminal for applying a voltage to the first electrode;

an inverter element having an input portion and an output portion, the input portion being connected to the second electrode of the ferroelectric capacitor;

a second input terminal for applying a voltage to the second electrode;

a switching element connected between the second electrode and the second input terminal for switching the voltage applied to second electrode; and a third input terminal for applying a voltage to the switching element to change the on/off state thereof;

the inverter element outputting a high-level voltage to the output portion when a low-level voltage, which is lower than the threshold of the inverter element, is applied to the input portion thereof, and outputting a low-level voltage to the output portion when a high-level voltage, which is higher than the threshold of the inverter element, is applied to the input portion thereof, the high-level voltage being applied to the first input terminal while the switching element is kept in the off state; and the voltage that is generated at second electrode by residual polarization in the ferroelectric film when a low-level voltage is sequentially applied being higher than the threshold voltage of the inverter element;

the method for driving the non-volatile latch circuit also comprising a high-level latch step, a low-level latch step, and a reset step;

the high-level latch step having a first write substep followed by a first read substep, wherein in the first write substep, a low-level voltage, which is lower than the threshold of the inverter element, is applied to the second input terminal, and a high-level voltage is applied to the third input terminal to turn on the switching element, so that the voltage applied to the input portion is made a low-level voltage that is lower than the threshold of the inverter element, and in the first read substep, the voltage that is applied to the input portion is kept at a level that is lower than the threshold of the inverter element;

the low-level latch step having a second write substep followed by a second read substep, wherein in the second write substep, a high-level voltage is applied to the first input terminal to generate a high-level voltage that is higher than the threshold of the inverter element in the input portion, while the switching element is tuned off by applying a low-level voltage to the third input terminal, and in the second read substep, a high-level voltage, which is higher than the threshold of the inverter element, is kept in the input portion while the switching element is maintained in an off state; and in the reset step, a low-level voltage that is lower than the threshold of the inverter element is applied to the second input terminal, and the switching element is turned on.

10. A method for driving a non-volatile latch circuit according to claim 9, wherein the second write substep comprises the steps of:
applying a low-level voltage, which is lower than the threshold of the inverter element, to the second input terminal and making the switching element into an on state,
applying a high-level voltage to the first input terminal while keeping the switching element in an on state, and
turning off the switching element under the condition where a high-level voltage is applied to the first input terminal.

11. A method for driving a non-volatile latch circuit according to claim 10, wherein the first write substep comprises the steps of:
making the switching element into an on state while applying a low-level voltage, which is lower than the threshold of the inverter element, to the second input terminal, and applying a high-level voltage to the third input terminal,
applying a high-level voltage, which is higher than the threshold of the inverter element, to the second input terminal while keeping the switching element in an on state, and
applying a low-level voltage, which is lower than the threshold of the inverter element, while keeping the switching element in an on state.

12. A method for driving a non-volatile latch circuit according to claim 9, wherein the inverter element is formed of a complementary MOS inverter element composed of a first MISFET and a second MISFET,
the first MISFET comprises a first gate electrode, a first gate insulating film, a first source region, and a first drain region,
the second MISFET comprises a second gate electrode, a second gate insulating film, a second source region, and a second drain region,
the first gate electrode and the second gate electrode are connected to the input portion,
the first drain region and the second drain region are connected to the output portion,
a voltage is applied to the first source region in such a manner that the first source region has a high potential,
a voltage is applied to the second source region in such a manner that the second source region has a low potential,
the first MISFET becomes on when a low-level voltage, which is lower than the threshold of the inverter element, is applied to the input portion, and becomes off when a high-level voltage, which is higher than the threshold of the inverter element, is applied to the input portion,
the second MISFET becomes on when a high-level voltage, which is higher than the threshold of the inverter element, is applied to the input portion, and becomes off when a low-level voltage, which is lower than the threshold of the inverter element, is applied to the input portion.

13. A method for driving a non-volatile latch circuit according to claim 12, wherein the threshold voltage of the second MISFET is the threshold voltage of the inverter element.

14. A method for driving a non-volatile latch circuit according to claim 12, wherein the first MISFET is p-type and the second MISFET is n-type.

15. A method for driving a non-volatile latch circuit according to claim 12, wherein the voltage that makes the first source region high potential is a positive supply voltage.

16. A method for driving a non-volatile latch circuit according to claim 12, wherein the voltage that makes the second source region low potential is an earth voltage.

17. A method for driving a non-volatile latch circuit according to claim 9, wherein the low-level voltage, which is lower than the threshold of the inverter element, is an earth voltage.

18. A method for driving a non-volatile latch circuit according to claim 9, wherein the ferroelectric film is formed of strontium bismuth tantalate.

19. A method for driving a non-volatile latch circuit according to claim 9, wherein the high-level voltage applied to the first input terminal is higher than the high-level voltage that is applied to the third input terminal.

20. A method for driving a non-volatile latch circuit according to claim 9, wherein during the first read substep, a voltage lower than the threshold of the inverter element is applied to the first input terminal.

21. A method for driving a non-volatile latch circuit according to claim 20, wherein the low-level voltage, which is lower than the threshold of the inverter element is an earth voltage.

* * * * *

UNITED STATES PATENT AND TRADEMARK OFFICE
CERTIFICATE OF CORRECTION

PATENT NO. : 6,845,032 B2
DATED : January 18, 2005
INVENTOR(S) : Kenji Toyoda et al.

It is certified that error appears in the above-identified patent and that said Letters Patent is hereby corrected as shown below:

<u>Title page,</u>
Item [75], Inventors, change the data for the second inventor from "Takashi Ohtsuka, Toyomaka (JP)" to -- Takashi Ohtsuka, Osaka (JP) --; change the data for the third inventor from "Kiyoshi Morimoto, Hirakata (JP)" to -- Kiyoshi Morimoto, Osaka (JP). --

Signed and Sealed this

Twenty-fourth Day of May, 2005

JON W. DUDAS
*Director of the United States Patent and Trademark Office*